United States Patent [19]
Eilers et al.

[11] Patent Number: 5,659,947
[45] Date of Patent: Aug. 26, 1997

[54] DEVICE FOR AUTOMATICALLY POPULATING A TOP AND A BOTTOM SIDE OF PRINTED-CIRCUIT BOARDS WITH SMD COMPONENTS

[75] Inventors: Norbert Eilers, Hildesheim; Ansgar Graen, Diekholzen, both of Germany

[73] Assignee: Blaupunkt-Werke GmbH, Hildesheim, Germany

[21] Appl. No.: 648,070

[22] PCT Filed: Sep. 12, 1995

[86] PCT No.: PCT/DE95/01245

§ 371 Date: Jul. 18, 1996

§ 102(e) Date: Jul. 18, 1996

[87] PCT Pub. No.: WO96/09751

PCT Pub. Date: Mar. 28, 1996

[30] Foreign Application Priority Data

Sep. 20, 1994 [DE] Germany ............... 44 33 565.2

[51] Int. Cl.⁶ .................. H05K 3/12; H05K 3/34; B23P 21/00
[52] U.S. Cl. ................ 29/740; 29/742; 29/743; 29/793; 29/840; 156/542; 156/566; 198/341; 228/6.2; 228/37; 228/180.21; 414/273
[58] Field of Search ............ 29/430, 740–743, 29/793, 840, DIG. 44, 703; 156/542, 566; 198/341, 355; 228/6.2, 37, 180.21; 414/273, 737, 752

[56] References Cited

U.S. PATENT DOCUMENTS

| | | | |
|---|---|---|---|
| 4,719,694 | 1/1988 | Herberich et al. | 198/341 X |
| 5,003,692 | 4/1991 | Izumi et al. | 228/6.2 X |
| 5,329,690 | 7/1994 | Tsuji et al. | 29/742 X |
| 5,338,381 | 8/1994 | Hidese | 156/542 X |
| 5,452,509 | 9/1995 | Suzuki et al. | 29/740 |
| 5,564,183 | 10/1996 | Satou et al. | 29/840 |

FOREIGN PATENT DOCUMENTS

| | | | |
|---|---|---|---|
| 491448 | 6/1992 | European Pat. Off. | 29/742 |
| 4106689 | 10/1991 | Germany | 29/742 |
| 5326577 | 12/1993 | Japan | 29/740 |
| 886344 | 11/1981 | U.S.S.R. | 29/742 |
| 1829131 | 7/1993 | U.S.S.R. | 29/743 |

OTHER PUBLICATIONS

"Surface–Mounted Device Placement" IBM Technical Disclosure Bulletin, vol. 30, No. 1, Jun. 1987, pp. 228–234.

*Primary Examiner*—Peter Vo
*Attorney, Agent, or Firm*—Kenyon & Kenyon

[57] ABSTRACT

A device is described for automatically populating the top and bottom side of printed-circuit boards with SMD components, synchronously controllable switching points being arranged in the entry and outlet of the SMD (surface mounted device) insertion device.

1 Claim, 1 Drawing Sheet

DEVICE FOR AUTOMATICALLY POPULATING A TOP AND A BOTTOM SIDE OF PRINTED-CIRCUIT BOARDS WITH SMD COMPONENTS

FIELD OF THE INVENTION

The present invention relates to a device for automatically populating the top and bottom side of printed-circuit boards with SMD (surface mounted device) components.

BACKGROUND INFORMATION

In order for the printed-circuit boards to be populated, the printed circuit boards include a network of printed circuit traces on their bottom side, which functionally interconnect the component connection points provided therein. These printed-circuit boards run on a conveyor belt through the individual processing stations and also pass through devices for fitting the printed-circuit board from above, so-called automatic insertion equipment or SMD-insertion devices, which transport the components to predetermined positions on the top side of the printed-circuit board. For this purpose, the automatic insertion equipment is provided with grippers, which are able to be controlled in a horizontal plane to every point of the printed-circuit board surface. The components, themselves, are stockpiled on a carrier, which in many cases is rolled up into a spool. The components are removed from this carrier, one after another, e.g., by means of a component extractor (suction device) and taken to the designated position.

After all the SMD components required for the circuit arrangements mapped on the printed-circuit board are set down, the components are soldered to their connection points in a soldering station, and the circuit arrangement is then checked for proper functioning.

The desire to keep the overall space required for these circuit arrangements to a minimum has resulted in SMD components being mounted on the bottom side of the printed-circuit boards as well. For this purpose, after leaving the soldering station, the printed-circuit board is lifted off the conveyor belt and is inverted, and the bottom side of the printed-circuit board, now located on top, is provided with an adhesive agent at the surface mounted placements there for the SMD components. The printed-circuit board subsequently passes through second automatic insertion equipment or SMD-insertion devices and the now upwardly pointing bottom side of the printed-circuit board is fitted with other SMD components.

Following the second automatic insertion equipment, the adhesive agent is cured in a hardening station, so that the components adhere securely to the printed-circuit board; the printed-circuit board is then inverted again and subsequently run through a wave-soldering station to solder the components on the bottom side to the printed circuit traces.

In some instances, components, which are not able to be manipulated using a component extractor (suction device), are even placed beforehand by hand on the top side of the printed-circuit board.

SUMMARY OF THE INVENTION

The underlying object of the present invention is to minimize the placement of components by hand if possible. Accordingly, a device is provided for automatically populating the top and bottom side of printed-circuit boards with SMD components, which includes synchronously controllable switching points that are arranged in the entry and outlet of the SMD insertion device.

DETAILED DESCRIPTION

Figure 1:
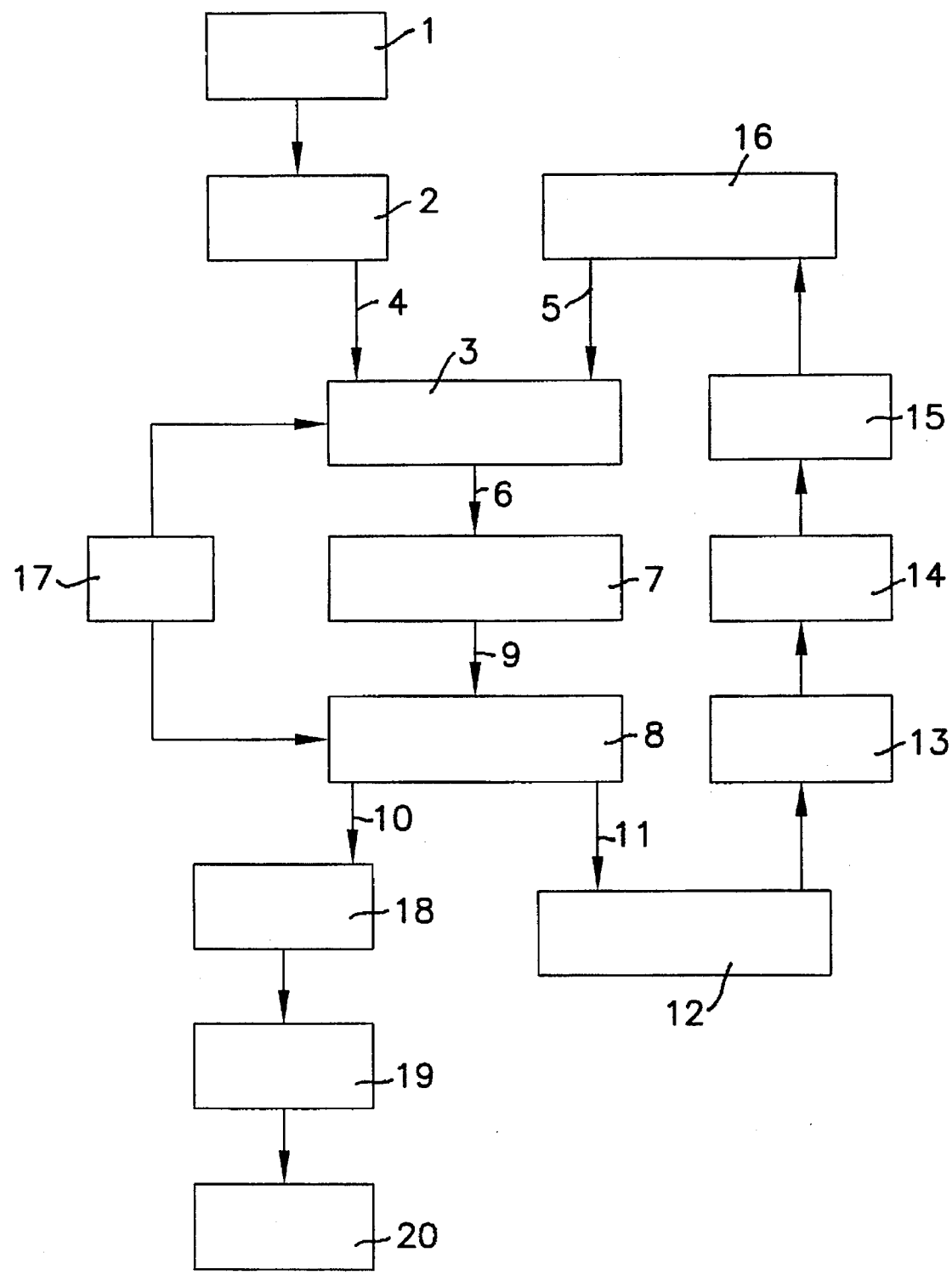
FIG. 1 shows a functional block diagram (flow chart) of a device according to the present invention.

The device according to the present invention removes the unfinished printed-circuit boards from a storage container 1 and places them on a conveyor belt with the top side pointing up. Soldering paste is imprinted in a generally known way on to this side of the unfinished printed-circuit board in the subsequent soldering-paste printing station 2 at the contact points for the SMD components to be fitted, but also at the contact holes for connections for printed circuit traces on the top side to such printed circuit traces on the bottom side of the printed-circuit board. The printed-circuit board is then situated in front of a first switch point (rounting means) 3 having two entries 4 and 5 and one outlet 6, which is situated in the entry of an SMD insertion device 7.

If the first switch point 3 is controlled by the switch-point control 17 in the direction of passage, then the top side of the printed-circuit board is populated with SMD components. For this purpose, in the SMD insertion device 7, the component extractor (suction device) is controlled to the placements for the SMD components, and the component is lowered into the soldering paste.

A second switch point 8 having one entry 9 and two outlets 10 and 11 joins up with the outlet of the SMD insertion device 7. If the top side of the printed-circuit board in the SMD insertion device is provided with all components, then the printed-circuit board is guided by the controlled switch point 8 into a station 12 to reverse the direction of travel of the printed-circuit board. Joining up with the outlet of the reversing station 12 is a reflow soldering station 13, where the printed-circuit boards are heated by infrared emitter lamps, so that the solder in the solder paste melts, while the other constituents of the solder paste vaporize. The printed-circuit boards then initially run through a printed-circuit board inverting device 14, which inverts the printed-circuit board so that the bottom side is on the top, and then through an adhesive-application station 15, where adhesive agent is applied in a punctiform manner between the component-connection soldering points at the placements of the SMD components.

The conveyor belt with the printed-circuit boards runs into a second reversing station 16 and is then situated in the second entry 5 of the first switch point 3.

As soon as the switch point 3 releases the printed-circuit board allowing it to be conveyed further, it once again runs through the SMD insertion device 7, this time with the bottom side that is imprinted with adhesive agent turned to the top. As soon as the bottom side is provided with all the components, the printed-circuit board again enters into the entry of the second switch point 8. The switch point is now so controlled by the switch point control 17 that the printed-circuit board is directed by way of the outlet 10 into an adhesive-curing station 18, which is followed by a second printed-circuit board inverting device 19. After that, the inverted printed-circuit board travels on the conveyor belt through a wave-soldering bath 20, in which the SMD components are soldered to the circuit-board conductors.

In case of need, one can integrate in the process sequence described so far, testing stations and insertion sites for components with radial or axial connections, or also for screens or housing parts that need to be soldered with the grounded surfaces on the printed-circuit board.

If the spatial conditions require it, the first station 12 for reversing the direction of travel of the printed-circuit boards can also be integrated in the process sequence, e.g., behind the reflow station 13, so that said reflow station 13 would be situated before the location where the printed-circuit board reverses its travel.

The turning station (board inverting device) 14 and the adhesive-application station 15 can also be integrated directly behind the outlet of the reflow station 13, when the direction of travel not reversed two times until after said outlet.

In the final analysis, the intended aim here is for the two extended surfaces of the printed-circuit boards to have a singular use with respect to their population, in spite of being imprinted with different adhesive agents for the SMD components in the SMD insertion device. To accomplish this, the directions of passage of both controllable switch points must change after each printed-circuit board passes through, and the first switch point 3 and the second switch point 8 must be controlled synchronously by the switch point control 17 while the directions of passage continually change to allow the printed-circuit board that is imprinted with soldering paste on its surface and is entering into the first switch point, after running through the SMD insertion device, to be routed, when emerging from the second switch point, into the reflow soldering means, and to allow the next printed-circuit board that is imprinted with adhesive agent on its bottom side, after emerging from the first switch point and running through the SMD insertion device, to be guided by the second switch point into the adhesive-curing means.

I claim:

1. A device for automatically populating a top and a bottom side of printed-circuit boards with SMD components, the device comprising:

an SMD-insertion apparatus having an insertion inlet and an insertion outlet;

a transporting device for transporting the printed-circuit boards through the SMD-insertion apparatus;

a first controllable switch point including a first and a second entry and a first outlet, the first outlet positioned substantially at the insertion inlet of the SMD-insertion apparatus;

a second controllable switch point including a third entry and a second and a third outlet, the third entry positioned substantially at the insertion outlet of the SMD-insertion apparatus;

a soldering-paste printing station arranged before the first entry of the first controllable switch point for imprinting the top side of each of the printed-circuit boards with a soldering paste;

a first reversing station arranged after the third outlet of the second switch point for reversing a travel direction of the printed-circuit boards;

a reflow soldering station and a first circuit board inverting device for inverting each of the printed-circuit boards;

an adhesive application station for applying an adhesive agent to each inverted one of the printed-circuit boards;

a second reversing station for reversing the travel direction of the printed-circuit boards, the second reversing station including a fourth outlet for coupling with the second entry of the first controllable switch point;

an adhesive curing station for curing the adhesive agent, the adhesive curing station being coupled to the second outlet of the second controllable switch point;

a second circuit board inverting device for inverting the printed-circuit boards; and a wave-soldering bath station for soldering the SMD-components on the bottom side of each of the printed-circuit boards, the SMD-components being soldered according to imprinted circuit traces arranged on the bottom side of each of the printed-circuit boards, wherein the travel direction of the printed-circuit boards through each of the first and second controllable switch points is changed after each of the printed-circuit boards passes through the respective first and second controllable switch points, and wherein each of the first and second controllable switch points is synchronously controlled for guiding each of the printed-circuit boards soldered on the top side into the reflow soldering station and for guiding each of the printed-circuit boards applied with the adhesive agent on the bottom side into the adhesive curing station, each of the printed-circuit boards soldered on the top side entering into the first controllable switch point after passing through the SMD-insertion apparatus and emerging from the second controllable switch point, each of the printed-circuit boards applied with the adhesive agent on the bottom side being guided by the second controllable switch point after emerging from the first controllable switch point and passing through the SMD-insertion apparatus.

* * * * *